United States Patent
Shen et al.

(10) Patent No.: US 10,780,653 B2
(45) Date of Patent: Sep. 22, 2020

(54) SLICING AND PRINTING METHOD FOR COLOUR 3D PHYSICAL MODEL WITH PROTECTIVE FILM

(71) Applicants: XYZPRINTING, INC., New Taipei (TW); KINPO ELECTRONICS, INC., New Taipei (TW)

(72) Inventors: Shyh-Yong Shen, New Taipei (TW); Kwan Ho, New Taipei (TW); Yang-Teh Lee, New Taipei (TW); Ting-Chun Chu, New Taipei (TW)

(73) Assignees: XYZPRINTING, INC., New Taipei (TW); KINPO ELECTRONICS, INC., New Taipei (TW)

( * ) Notice: Subject to any disclaimer, the term of this patent is extended or adjusted under 35 U.S.C. 154(b) by 295 days.

(21) Appl. No.: 15/861,654

(22) Filed: Jan. 3, 2018

(65) Prior Publication Data
US 2019/0061277 A1 Feb. 28, 2019

(30) Foreign Application Priority Data
Aug. 31, 2017 (CN) .......................... 2017 1 0771395

(51) Int. Cl.
*B29C 67/00* (2017.01)
*B29C 64/118* (2017.01)
(Continued)

(52) U.S. Cl.
CPC ........ *B29C 67/0007* (2013.01); *B29C 64/112* (2017.08); *B29C 64/118* (2017.08);
(Continued)

(58) Field of Classification Search
CPC .............................................. B29C 67/0007
See application file for complete search history.

(56) References Cited

U.S. PATENT DOCUMENTS

| | | |
|---|---|---|
| 2014/0300017 A1 | 10/2014 | Wighton et al. |
| 2016/0009029 A1 | 1/2016 | Cohen et al. |
| 2017/0136706 A1 | 5/2017 | Hakkaku |

FOREIGN PATENT DOCUMENTS

| | | |
|---|---|---|
| JP | 2001150556 A | 6/2001 |
| JP | 201619889 A | 12/2016 |

(Continued)

OTHER PUBLICATIONS

Search Report dated Jul. 18, 2018 of the corresponding European patent application.

(Continued)

*Primary Examiner* — Larry W Thrower
(74) *Attorney, Agent, or Firm* — Chun-Ming Shih; HDLS IPR Services (57) ABSTRACT

A slicing and printing method for colour 3D physical model with protective film is provided. The method executes a slicing process to colour 3D object data for generating multiple layers of object slice data and colour slice data, generate multiple layers of body slice data and multiple layers of protection slice data according to multiple layers of the object slice data, manufacture multiple layers of body slice physical models according to multiple layers of the body slice data, color each layer of the manufactured body slice physical model according to the same layer of the colour slice data, and use light-transmissive print materials to manufacture multiple layers of protection slice physical models according to multiple layers of the protection slice data. The method can effectively make the manufactured colour 3D physical model be with light-transmissive protective film, and prevent the colour 3D physical model from decolorization.

11 Claims, 9 Drawing Sheets

(51) Int. Cl.
*G03F 7/00* (2006.01)
*B29C 64/393* (2017.01)
*B29C 64/112* (2017.01)
*B29C 64/40* (2017.01)
*B29C 64/386* (2017.01)
*H04N 1/60* (2006.01)
*B29C 64/336* (2017.01)
*B33Y 50/02* (2015.01)
*B33Y 10/00* (2015.01)
*B33Y 30/00* (2015.01)
*B33Y 50/00* (2015.01)
*B33Y 40/00* (2020.01)

(52) U.S. Cl.
CPC .......... *B29C 64/336* (2017.08); *B29C 64/386* (2017.08); *B29C 64/393* (2017.08); *B29C 64/40* (2017.08); *G03F 7/0037* (2013.01); *H04N 1/60* (2013.01); *B33Y 10/00* (2014.12); *B33Y 30/00* (2014.12); *B33Y 40/00* (2014.12); *B33Y 50/00* (2014.12); *B33Y 50/02* (2014.12)

(56) References Cited

FOREIGN PATENT DOCUMENTS

| | | | |
|---|---|---|---|
| JP | 2016215576 | A | 12/2016 |
| JP | 2016215577 | A | 12/2016 |
| JP | 2017071211 | A | 4/2017 |
| WO | 2015072134 | A1 | 5/2015 |

OTHER PUBLICATIONS

Search Report dated Nov. 26, 2018 of the corresponding European patent application.

SLICING AND PRINTING METHOD FOR COLOUR 3D PHYSICAL MODEL WITH PROTECTIVE FILM

BACKGROUND OF THE INVENTION

Field of the Invention

The technical field relates to a slicing and printing method for colour 3D physical model and more particularly related to a slicing and printing method for colour 3D physical model with protective film.

Description of Related Art

To manufacture a colour 3D physical model, a modeling nozzle and a coloring nozzle are simultaneously arranged in a colour 3D printer of the related art.

During print, the colour 3D printer of the related art first controls the modeling nozzle to print a layer of slice physical model via using white print materials, and then controls the coloring nozzle to color the layer of printed slice physical model for manufacturing a layer of colour slice physical model. Via preforming above-mentioned print steps repeatedly, the colour 3D printer of the related art may manufacture a colour physical model composed of multiple layers of the stacked colour slice physical model.

However, due to the use of inkjet coloring technology, the colour layer of the colour 3D physical model manufactured by the colour 3D printer of the related art is easy to bleach or fade by touch, such as touching the water vapor or human hands.

To solve the above problems, the technology of the related art is to spray protective paints on the colour 3D physical model manually to form a layer of protective film on a surface of the colour 3D physical model.

However, above-mentioned technology of spraying protective paints manually not only costs manpower, but also causes problems of the protective paints splashing and reduction of air quality during spraying.

SUMMARY OF THE INVENTION

The present disclosed example is directed to a slicing and printing method for colour 3D physical model with protective film, the method has ability of printing a colour 3D physical model and a plurality of protective films thereof simultaneously.

One of the exemplary embodiments, a slicing and printing method for colour 3D physical model with protective film applied to a colour 3D printer comprising a modeling nozzle and a coloring nozzle, comprises following steps of: executing a slicing process for generating multiple layers of object slice data according to geometric information of colour 3D object data; in the slicing process, generating multiple layers of colour slice data according to colour information of the colour 3D object data; in the slicing process, generating multiple layers of body slice data according to the multiple layers of the object slice data, and generating multiple layers of protection slice data according to a plurality of contour information of the multiple layers of the object slice data; and controlling the modeling nozzle print to print multiple layers of body slice physical models layer by layer for manufacturing a body region of a colour 3D physical model according to the multiple layers of the protection slice data, controlling the coloring nozzle to color the layer of the body slice physical model according to the same layer of the colour slice data after each of the multiple layers of the body slice physical model has been printed and is necessary to be colored, and controlling the modeling nozzle print (330) to print multiple layers of protection slice physical models by using light-transmissive print materials layer by layer according to the multiple layers of the protection slice physical model for manufacturing a protective film region of the colour 3D physical model, wherein each of the multiple layers of the protection slice physical models surrounds the same layer of the body slice physical model.

The method can effectively make the manufactured colour 3D physical model be covered with a layer of light-transmissive protective film, and can prevent the colour 3D physical model from decolorization.

BRIEF DESCRIPTION OF DRAWING

The features of the present disclosed example believed to be novel are set forth with particularity in the appended claims. The present disclosed example itself, however, may be best understood by reference to the following detailed description of the present disclosed example, which describes an exemplary embodiment of the present disclosed example, taken in conjunction with the accompanying drawings, in which:

DETAILED DESCRIPTION OF THE INVENTION

In cooperation with attached drawings, the technical contents and detailed description of the present disclosed example are described thereinafter according to a preferable embodiment, being not used to limit its executing scope. Any equivalent variation and modification made according to appended claims is all covered by the claims claimed by the present disclosed example.

Figure 1:
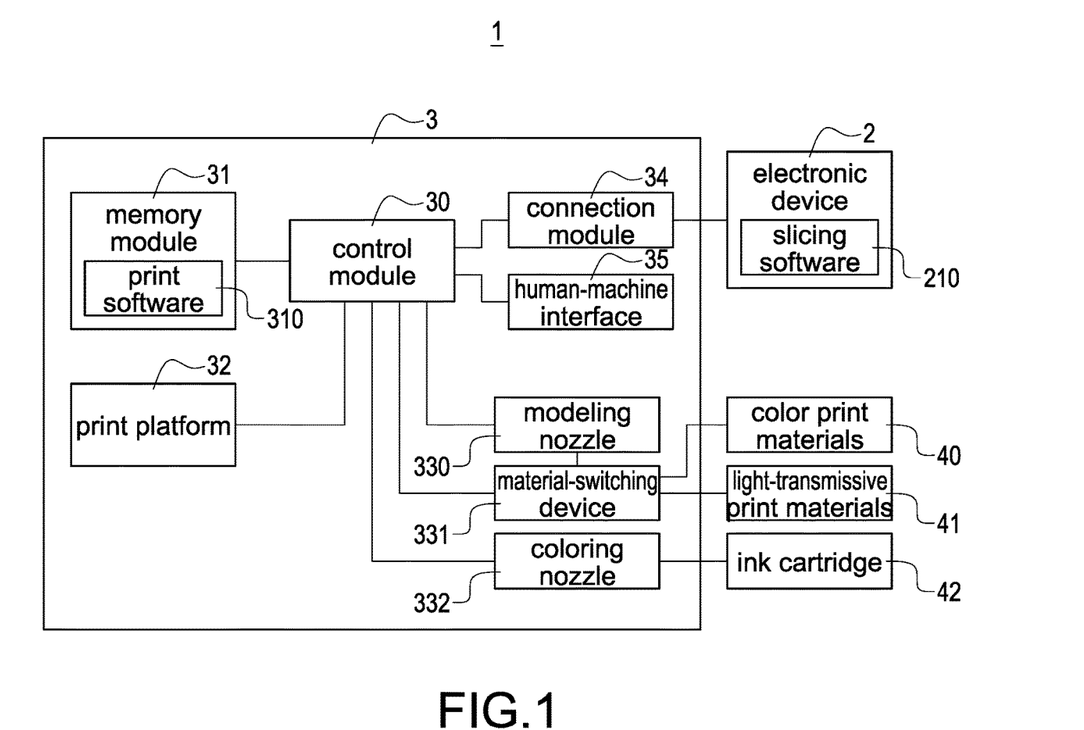
FIG. 1 is an architecture diagram of a colour 3D print system according to an embodiment of the present disclosed example.
Figure 2:
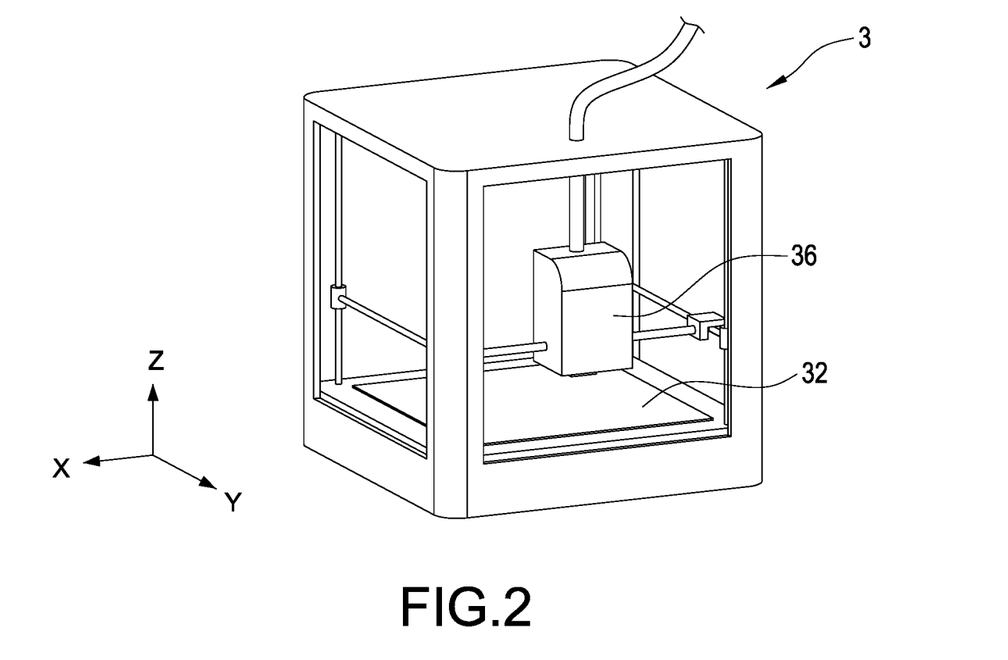
FIG. 2 is a schematic view of appearance of a colour 3D printer according to an embodiment of the present disclosed example.

Please refer to FIG. 1 and FIG. 2 simultaneously, FIG. 1 is an architecture diagram of a colour 3D print system according to an embodiment of the present disclosed example, and FIG. 2 is a schematic view of appearance of a colour 3D printer according to an embodiment of the present disclosed example. As shown in figures, the present disclosed example disclosed a 3D print system 1 having ability of printing colour 3D physical model and its protective film simultaneously, the colour 3D physical model manufactured by the present disclosed example has light-transmissive protective film and is without the need to spray protective paints additionally. The 3D print system 1 mainly comprises a slicing software 210 used to installed in an electronic device 2 (such as desktop, laptop, cloud server or smartphone) and a colour 3D printer. One of the exemplary embodiments, the slicing software 210 is stored in a memory of the electronic device 2. Above-mentioned memory is a non-transient computer readable recording media, a plurality of computer readable codes is recorded in the slicing software 210. After a processor (not shown in figures) of the electronic device 2 executing the slicing software 210, the processor of the electronic device 2 may load colour 3D object data corresponding to a colour 3D object, and perform each step of a slicing process described later to the colour 3D object data.

The colour 3D printer 3 may comprises a memory module 31, a print platform 32, a modeling nozzle 330, a coloring nozzle 332, a connection module 34, a human-machine interface 35 and a control module 30 electrically connected to above-mentioned modules.

The memory module 31 is used to store data, such as print software 310, the print software 310 may be a firmware or operating system of the colour 3D printer 3, but this specific example is not intended to limit the scope of the present disclosed example. The print platform 32 is used to carry the manufactured colour 3D physical model. The connection module 34 (such as USB module, Wi-Fi module or the other wired/wireless connection modules) is used to connect an external apparatus (such as the electronic device 2) for receiving print data (such as slice data described later). The human-machine interface 35 (such as buttons, a monitor, indicators, a buzzer, or any combination of above elements) is used to receive a user operation and output the print-related information. The control module 30 is used to control the colour 3D print 3.

The modeling nozzle 330 is used to print multiple layers of slice physical models. One of the exemplary embodiments, the modeling nozzle 330 is connected to a material supply device (not shown in figures) storing light-transmissive print materials 41, and has ability of using the light-transmissive print materials 41 to print.

One of the exemplary embodiments, the colour 3D printer 3 may implement a function of multi-materials print. More specifically, the colour 3D printer 3 further comprises a material-switching device 331 electrically connected to the control module 30, the material-switching device is connected to one material supply device storing the light-transmissive print materials 41 and another material supply device (not shown figures) storing colour print materials 40 Thus, the colour 3D printer 3 may control the modeling nozzle to use the light-transmissive print materials 41 to print, or use the colour print material 40 to print. One of the exemplary embodiments, the colour 3D printer 3 is a Fused Deposition Modeling (FDM) 3D printer, above-mentioned material supply device may provide thermoplastic materials (that is, the colour print materials 40 and the light-transmissive print materials 41, the print material 40-41 may be Acrylonitrile Butadiene Styrene (ABS) or Polylactic Acid (PLA)) to the modeling nozzle 330, the modeling nozzle 330 may heat the materials 40-41 for making the materials 40-41 molten and executing 3D printing. Besides, the colour print materials 40 and the light-transmissive print materials 41 under molten status are plastic and adhesive, and may be used to shape each slice physical model and stack slice physical models layer by layer for manufacturing the stable 3D physical model.

One of the exemplary embodiments, the colour print materials 40 and the light-transmissive print materials 41 may be the same or similar materials (such as both of them being the PLA materials) with the different colours or transmittances. Furthermore, the colour print materials 40 is background color (such as white or gray) with poor transmittance, so as to show the jet printed colour obviously. The light-transmissive print materials 41 is colorless or light color with better transmittance, so as to show the covered colour obviously.

The coloring nozzle 332 is connected to at least one ink cartridge 42 storing ink. One of the exemplary embodiments, the coloring nozzle 332 may comprises a plurality of sub-nozzles, each sub-nozzle is connected to each of the ink cartridges 42 of different colours (such as Cyan, Magenta, Yellow, and blacK), and may implement full-color printing via color mixing.

One of the exemplary embodiments, memory module 31 is a non-transient computer readable recording media, a plurality of computer readable codes is recorded in the print software 310. After the control module 30 executing the print software 30, the control module 30 may controls the modeling nozzle 330 and the coloring nozzle 332 to perform each step of print process described later.

One of the exemplary embodiments, the colour 3D printer comprises a motion mechanism 36. The motion mechanism 36 is used to control the modeling nozzle 330 and the coloring nozzle 332 to move in one or more axis (such as the three axes of X-Y-Z) for print.

One of the exemplary embodiments, the motion mechanism 36 is arranged on the print platform 32. More specifically, the motion mechanism 35 may control the print platform 32 to move between one or more axes (such as the three axes of X-Y-Z), and the modeling nozzle 330 and the coloring nozzle 332 may print without any motion.

One of the exemplary embodiments, the slicing software 210 may be stored in a memory module 31 of the colour 3D printer 3. More specifically, the control module 30 may perform each of the steps of the slicing process and the printing process described later after executing the slicing software 210 and the print software 310.

Figure 3:
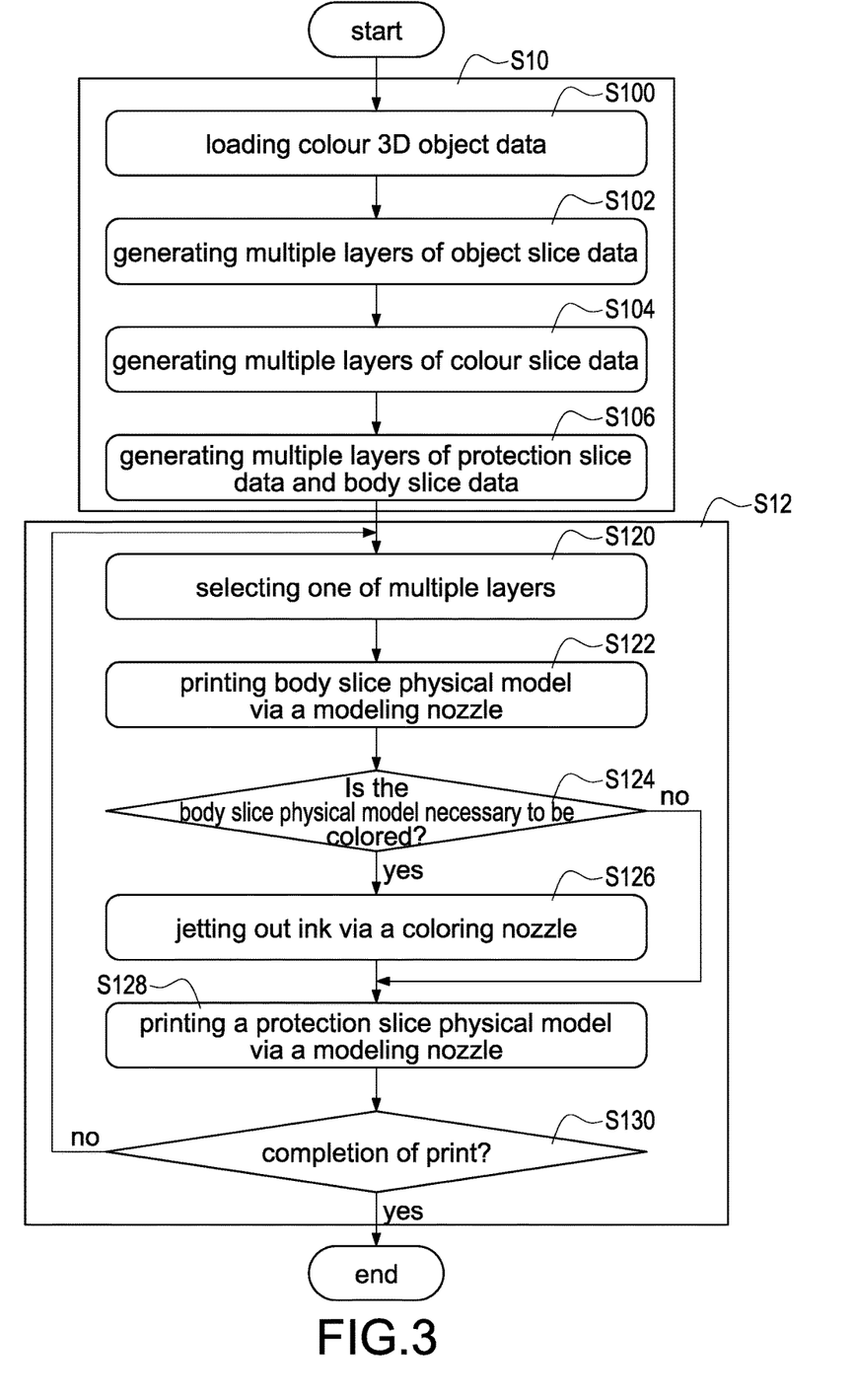
FIG. 3 is a flowchart of a slicing and printing method according to the first embodiment of the present disclosed example.

Please refer to FIG. 3 simultaneously, FIG. 3 is a flowchart of a slicing and printing method according to the first embodiment of the present disclosed example. The slicing and printing method for colour 3D physical model with protective film (hereinafter slicing and printing method for abbreviation) of each embodiment of the present disclosed example may be implemented by the 3D system shown in any of FIG. 1 and FIG. 2. More specifically, the slicing and printing method of each embodiment of the present disclosed example comprises a step S10 for executing a slicing process and a step S12 for executing a printing process. The electronic device 2 may perform each step of the slicing process of each embodiment of the present disclosed example after execution of slicing software 210. The colour 3D printer 3 may perform each step of the printing process of each embodiment of the present disclosed example after execution of the print software 310.

The slicing process of the present disclosed example will first be described. The slicing process (step S10) of the slicing and printing method of this embodiment comprises following steps.

Step S100: the electronic device 2 loads colour 3D object data form the memory of the electronic device 2. Abovementioned colour 3D object data is used to describe a colour 3D object, and records geometric information (such as a coordinate of each vertex of the colour 3D object or a shape of the colour 3D object) of the colour 3D object data and colour information (such as a colour value of each position of the colour 3D object) of the colour 3D object data. Furthermore, the electronic device 2 may render the corresponding colour 3D object after loading the colour 3D object data, and display the rendered colour 3D object on a display of the electronic device 2.

Step S102: the electronic device 2 generates multiple layers of the object slice data according to the geometric information of the colour 3D object data. Each layer of the object slice data comprises one of layer numbers sorted in order respectively.

Above-mentioned multiple layers of the object slice data are generated by execution of slicing process to the colour 3D object data, each of multiple layers of the object slice data corresponds to each of multiple layers of slice objects generated by dividing the colour 3D object respectively. One of the exemplary embodiments, each of multiple layers of the object slice data (such as a section of G-codes) is used to describe each of print paths. Each layer of the slice physical model is manufactured after the modeling nozzle 330 printing along each section of the print paths.

Step S104: the electronic device 2 generates multiple layers of the colour slice data according to the colour information of the colour 3D object data. each layer of the colour slice data comprises one of layer numbers sorted in order respectively.

One of the exemplary embodiments, each layer of colour slice data (such as a colour 2D image) is used to describe a colour of each position of the same layer of the slice object. The coloring nozzle 332 may color each position of the same layer of the slice physical model after mixing colors and jet printing according to the same layer of the colour slice data.

For example, if the colour 3D object may be divided into one hundred layers of the slice objects, one hundred layers of the object slice data and one hundred layers of the colour slice data are generated after execution of slicing process to the colour 3D object data. The one hundred layers of the object slice data respectively correspond to one hundred layers of the slice objects (the layer numbers are 1 to 100), and respectively describe a shape of the corresponding slice object. The one hundred layers of the colour slice data respectively correspond to one hundred layers of the slice objects (the layer numbers are 1 to 100), and respectively describe colours of the corresponding slice object.

One of the exemplary embodiments, if anyone of the multiple layers of the slice physical models corresponding to one of the multiple layers of the object slice data is not necessary to be colored, the electronic device may not generate the same layer of the colour slice data.

Step S106: the electronic device 2 selects each layer of the object slice data orderly, and generates the same layer of the protection slice data and the body slice data according to the selected layer of the object slice data. More specifically, electronic device 2 generates the same layer of the protection slice data according to the contour information of the selected layer of the object slice data (namely, each layer of the protection slice data corresponds to the contour of each layer of slice object), and generates the same layer of the body slice data according to the body size or the body shape of the selected layer of the object slice data (namely, each layer of the body slice data corresponds to the body of each layer of slice object).

One of the exemplary embodiments, the electronic device 2 generates the multiple layers of the protection slice data according to a plurality of the contour information of the multiple layers of the object slice data, and executes a shrinkage process to the multiple layers of the protection slice data (namely, shrinking horizontally the size of the multiple layers of the slice object) for generating the multiple layers of the body slice data. Thus, the colour 3D printer 3 may manufacture the colour 3D physical model which its size is consistent with a size of the colour 3D object after printing according to the protection slice data and the body slice data.

One of the exemplary embodiments, the electronic device 2 generates a copy of the multiple layers of the object slice data, makes the copy as the multiple layers of the body slice data, executes an outspreading process to the multiple layers of the object slice data (namely, outspreading horizontally the size of the multiple layers of the slice object), and generates the multiple layers of the protection slice data according to a plurality of the contour information (namely, a plurality of the processed contours of the multiple layers of the slice objects) of the multiple layers of the processed object slice data. Thus, the colour 3D printer 3 may manufacture the colour 3D physical model which its size is larger than a size of the colour 3D object after printing according to the protection slice data and the body slice data.

One of the exemplary embodiments, each layer of the protection slice data and body slice data (such as a section of G-codes) is used to describe each of print paths, the modeling nozzle 330 may manufacture a layer of the corresponding protection slice physical model and a layer of the corresponding body slice physical model after printing along each of print paths.

One of the exemplary embodiments, the electronic device 2 only generates partial layers of protection slice data (such as only generating the odd layers of the protection slice data, randomly determining the layer numbers of generating the protection slice data, or generating a layer of the protection slice data every third layers), rather than generates all layers of the protection slice data. Namely, in the manufactured colour 3D physical model, only a part of the body slice physical models is covered by the protective films, and another part of the body slice physical models are without any protective film. Due to a thickness of each slice physical model is ultra-thin, the protection effect be not reduced significantly even lack of some layers of the protective films. The present disclosed example can effectively reduce the usage of the light-transmissive print materials 41 under a premiss of the protection effect being not reduced significantly.

Please be noted that each of the multiple layers of the protection slice physical models which the modeling nozzle 330 prints by using the light-transmissive print materials 41 may be as a layer of light-transmissive protective film. Namely, the light-transmissive protection slice physical models printed by the modeling nozzle 330 not only reflect the colours of the covered body slice physical models and the colour coatings, but also separates the body slice physical models and the colour coatings from the external environment, so as to prevent the body slice physical models and the colour coatings from bleaching or fading.

After execution of the slicing process, the electronic device 2 may transmit the multiple layers of the generated protection slice data, the multiple layers of the generated body slice data and the multiple layers of the generated colour slice data to the colour 3D printer 3.

Thus, the present disclosed example can effectively execute the slicing process to generate the multiple layers of protection slice data for printing the protective films of the colour 3D physical model, the multiple layers of body slice data for printing the body of the colour 3D physical model and the multiple layers of colour slice data for coloring, so as to make the colour 3D printer 3 print the colour 3D physical model with protective film via using the modeling nozzle 330 and the coloring nozzle 332.

Then, the printing process of the present disclosed example will be described. The printing process of the printing and slicing method of this embodiment comprises following steps.

Step S120: the control module 30 of the colour 3D printer 3 selects one of the multiple layers of protection slice data in order, and selects the same layers of the body slice data and the colour slice data, such as selecting the first layer of the protection slice data, the body slice data and the colour slice data.

Step S122: the control module 30 controls the modeling nozzle 330 to print a layer of the body slice physical model according to the selected layer of the body slice data.

One of the exemplary embodiments, the control module 30 controls the modeling nozzle 330 to use the light-transmissive print materials 41 to move along the print path corresponding to the selected layer of the body slice data and extrude the molten light-transmissive print materials 41 simultaneously for printing a layer of the light-transmissive body slice physical model.

One of the exemplary embodiments, the control module 30 first controls the material-switching device 331 to switch to provide the colour print materials 40, and then controls the modeling nozzle 330 to use the colour print materials 40 to move along the print path corresponding to the selected layer of the body slice data and extrude the molten colour print materials 40 simultaneously for printing a layer of the colour body slice physical model.

Step S124: the control module 30 determines whether the layer of the printed slice physical model (such as body slice physical model or protection slice physical model) is necessary to be colored.

One of the exemplary embodiments, the control module 30 determines that the layer of the printed slice physical model is not necessary to be colored if the same layer of the colour slice data does not exist.

One of the exemplary embodiments, the control module 30 determines that the layer of the printed slice physical model is not necessary to be colored if the same layer of the colour slice data is colorless (such as the layer of the colour slice data being a transparent 2D image) or only comprises the specific colour (such as the layer of the colour slice data being a white 2D image).

If the control module 30 determines that the layer of the printed slice physical model is necessary to be colored, the control module 30 performs the step S126.

Otherwise, the control module 30 performs the step S128.

Step S126: the control module 30 controls the coloring nozzle 332 to jet out ink of the ink cartridge 42 on each position of the layer of the printed slice physical model according to the same layer of the colour slice data.

One of the exemplary embodiments, the control module 30 controls the coloring nozzle 332 to mix the ink with the different colours and jet out mixed ink on the corresponding position of the layer of the printed slice physical model for coloring according to a colour distribution of the same layer of the colour slice data (such as colour 2D image).

One of the exemplary embodiments, the control module 30 controls the coloring nozzle 332 to color whole surface of the layer of the printed slice physical model if the control module 30 determines that the layer of the printed slice physical model is a sub top layer (the penultimate layer) or bottom layer (the first layer). And the control module 30 controls the coloring nozzle 332 to color the partial surface (such as outer surface) of the layer of the printed slice physical model if the control module 30 determines that the layer of the printed slice physical model is a middle layer.

Step S128: the control module 30 controls the modeling nozzle 40 to use the light-transmissive print materials 41 to print a layer of protection slice physical model on a contour of the same layer of the printed body slice physical model. Namely, the layer of the printed protection slice physical model surrounds the same layer of the body slice physical model and separates the same layer of the body slice physical model from the external environment.

Step S130: the control module 30 determines whether completion of print of the colour 3D physical model. Namely, the control module 30 determines whether a body region of the colour 3D physical model had been printed via referring to all of the multiple layers of the body slice data, the colour 3D physical model had been colored via referring to all of the multiple layers of colour slice data, and a protective film region of the colour 3D physical model had been printed via referring to all of the multiple layers of the body protection slice data.

If the control module determines that the print of the colour 3D physical model is not done, the control module 30 performs the step S120-S128 again for selecting the other layer of the slice data (such as selecting the second layer of the body slice data, protection slice data and colour slice data), printing the other layer of the slice physical model and protective film thereof (such as printing the second layer of the body slice physical model, coloring the second layer of the body slice physical model, and printing the second layer of the protection slice physical model).

The method can effectively make the manufactured colour 3D physical model be covered with a layer of light-transmissive protective film, and can prevent the colour 3D physical model from decolorization.

Figure 4:
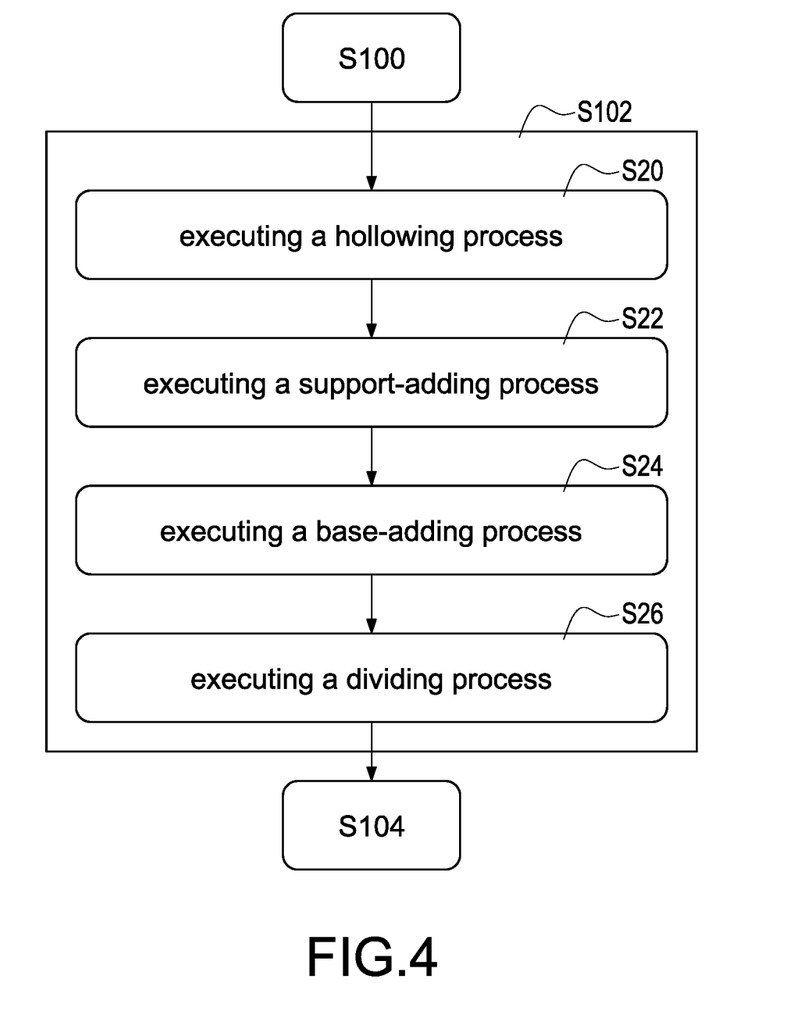
FIG. 4 is a partial flowchart of a slicing and printing method according to the second embodiment of the present disclosed example.

Please refer to FIG. 3 and FIG. 4, FIG. 4 is a partial flowchart of a slicing and printing method according to the second embodiment of the present disclosed example. The slicing and printing method of this embodiment further implement a hollowing function, a support-adding function, and a base-adding function. The hollowing function can make the colour 3D printer 3 manufacture a hollowing colour 3D physical model, and reduce the usage of the printed materials. The support-adding function can make the colour 3D printer 3 add a support structure in the colour 3D physical model appropriately during print, so as to prevent the colour 3D physical model from collapsing and print failure. The base-adding function can make the colour 3D printer 3 add a base structure in the colour 3D physical model appropriately during print, so as to prevent the colour 3D physical model from overturning and print failure. Compare to the slicing and printing method shown in FIG. 3, the step S102 of the slicing and printing method of this embodiment comprises following steps.

Step S20: the electronic device 2 executes a hollowing process to the colour 3D object data for hollowing the colour 3D object corresponding to the colour 3D object data (namely, the colour 3D object is hollow).

The present disclosed example can effectively reduce the total area of the multiple layers of the manufactured body slice physical model via the hollowing process, and then effectively reduce the usage of the print materials.

Step S22: the electronic device 2 executes a support-adding process to the colour 3D object data for generating the multiple layers of support slice data corresponding to at least one support object(s).

Thus, the colour 3D printer 3 may manufacture the corresponding support structure after print according to the multiple layers of support slice data. One of the exemplary embodiments, each layer of the support slice data comprises a layer number respectively.

The present disclosed example can effectively prevent the colour 3D physical model from collapsing caused by insufficient support force during print via the support-adding process, and then effectively improve the probability of printing successfully.

Step S24: the electronic device 2 executes a base-adding process to the colour 3D object data for generating the multiple layers of base slice data corresponding to a base object. Thus, the colour 3D printer 3 may manufacture the corresponding base structure after print according to the multiple layers of base slice data. One of the exemplary embodiments, each layer of the base slice data comprises a layer number respectively.

The present disclosed example can effectively prevent the colour 3D physical model from overturning caused by lost balance during print via executing the base-adding process to increase the contact area between the colour 3D physical model and the print platform 32, and then effectively improve the probability of printing successfully.

Step S26: the electronic device 2 executing a dividing process to the colour 3D object data to divide the colour 3D object data into a plurality of object slice data for dividing the corresponding colour 3D object into a plurality of slice objects according to the geometric information of the processed colour 3D object data and a default thickness value (such as 10 pixels or 0.2 millimeter). Then, the electronic device 2 performs the step S104.

Above-mentioned hollowing process, support-adding process, base-adding process and dividing process are the common techniques in this technical field, the relevant description is omitted for brevity.

Figure 5:
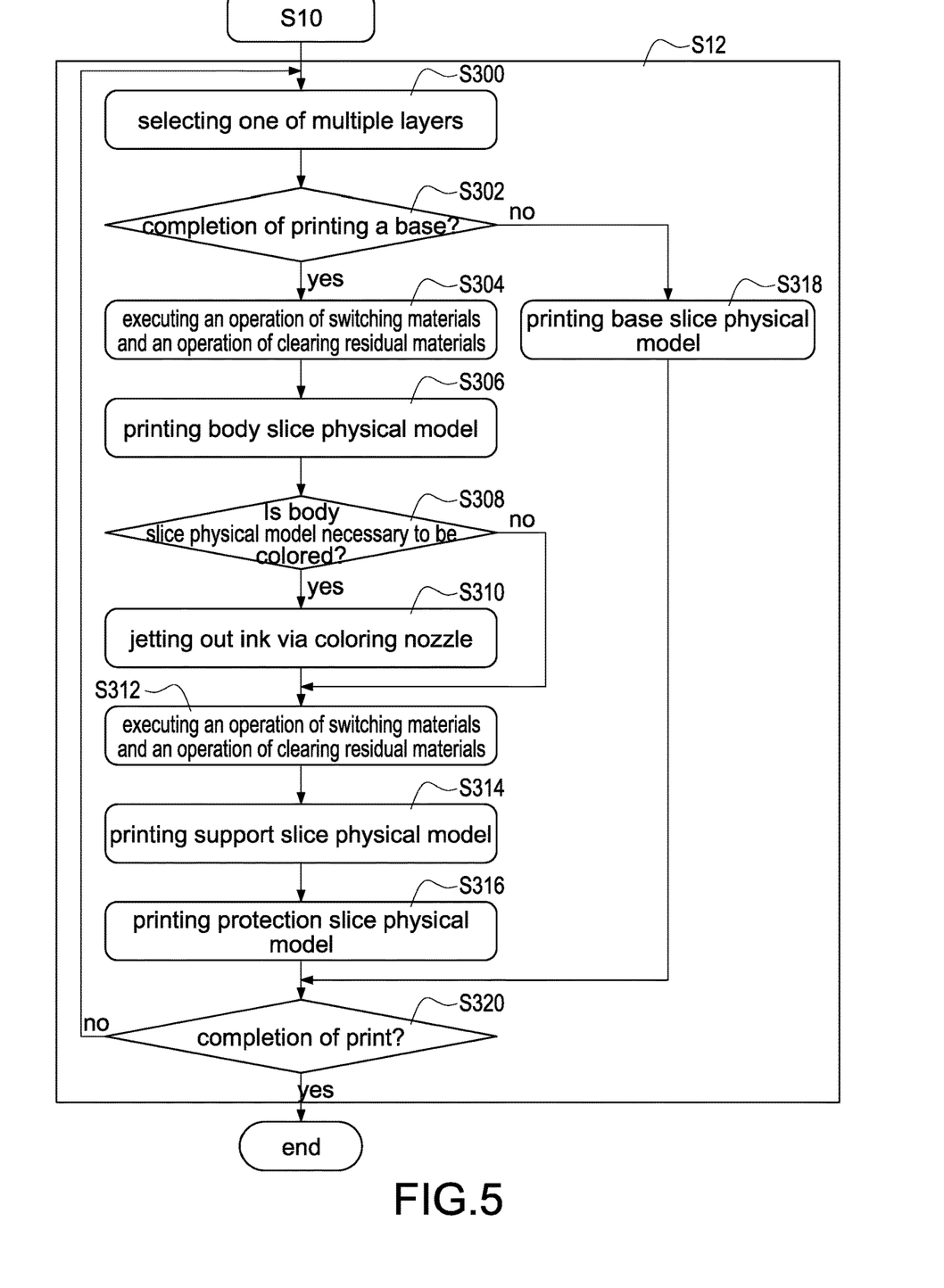
FIG. 5 is a partial flowchart of a slicing and printing method according to the third embodiment of the present disclosed example.

Please refer to FIG. 3 to FIG. 5 simultaneously, FIG. 5 is a partial flowchart of a slicing and printing method according to the third embodiment of the present disclosed example. In this embodiment, the colour 3D printer 3 controls the material-switching device 331 to switch to provide colour print materials 40 for printing the body slice physical models, and controls the material-switching device 331 to switch to provide light-transmissive print materials 41 for printing the protection slice physical models. Compare to the slicing and printing method shown in FIG. 4, the step S12 of the slicing and printing method of this embodiment comprises following steps.

Step S300: the control module 30 selects one of the multiple layers of slice data in order, such as selecting the first layer of the protection slice data, body slice data, base slice data, support slice data and colour slice data.

Step S302: the control module 30 determines whether completion of printing a base structure, and determines whether all of the multiple layers of base physical models had been printed according to all of the multiple layers of base slice data.

If the control module 30 determines completion of printing a base structure, the control module 30 performs a step S304. Otherwise, the control module 30 performs a step S318.

Step S304: the control module 30 executes an executing an operation of switching materials, and executes an operation of clearing residual materials after completion of the operation of switching materials. More specifically, the control module 30 first controls the material-switching device 331 to switch to provide the colour print materials 40, and controls the modeling nozzle 330 to extrude the print materials (such as extruding the print materials on another position of the print platform 32, such as a trash can for print materials, or printing the support structure via using the residual materials) for consuming the residual light-transmissive print materials 41.

Step S306: the control module 30 controls the modeling nozzle 330 to use the colour print materials 40 to print a layer of the body slice physical model according to the selected layer of the body slice data.

Step S308: the control module 30 determines whether the layer of the printed body slice physical model is necessary to be colored according to the same layer of the colour slice data.

If the control module 30 determines that the layer of the printed body slice physical model is necessary to be colored, the control module performs a step S310. Otherwise, the control module 30 performs a step S312.

Step S310: the control module 30 control the coloring nozzle 332 to color the layer of the printed body slice physical model according to the same layer of the colour slice data.

Step S312: the control module 30 executes the operation of switching materials, and executes an operation of clearing residual materials after completion of the operation of switching materials. More specifically, the control module 30 first controls the material-switching device 331 to switch to provide the light-transmissive print materials 41, and controls the modeling nozzle 330 to extrude the print materials (such as extruding the print materials on another position of the print platform 32, such as a trash can for print materials, or printing the support structure via using the residual materials) for consuming the residual light-transmissive print materials 41 colour print materials 40.

Step S314: the control module 30 controls the modeling nozzle 330 to use the light-transmissive print materials 41 to print a layer of the support slice physical model according to the selected layer of the support slice data.

One of the exemplary embodiments, the control module 30 may first performs the step S314, and then performs the step S312. Namely, the control module 30 may first controls the modeling nozzle 330 to use the colour print materials 40 to print a layer of the support physical model, and then executes the operation of switching materials for using the light-transmissive print materials 41 to print a layer of the protection slice physical model. Thus, the printed protective films and the printed support structure of the colour 3D physical model have are the different colours, so as to make the user easy to recognize the support structure and remove the support structure.

Step S316: the control module 30 controls the modeling nozzle 330 to use the light-transmissive print materials 41 to print the same layer of the protection slice physical model along a contour of the same layer of the body slice physical model according to the selected layer of the protection slice data. Then, the control module performs a step S320.

If the control module 30 determines that not completion of printing a base structure, the control module 30 performs the step S318: the control module 30 controlling the modeling nozzle 330 to print a layer of the base physical model according to the selected layer of the base slice data. Then, the control module 30 performs the step S320.

Step S320: the control module 30 determines whether completion of printing the colour 3D physical model.

If the control module 30 determines that not completion of printing the colour 3D physical model, the control module 30 performs the step S300-S318 again for selecting the other layer of the slice data (such as selecting the second layer of the body slice data, the protection slice data, the base slice data, the support slice data and the colour slice data), printing the other layer of the slice physical model and protective film thereof (such as printing the second layer of the body slice physical model, base slice physical model, and/or support slice physical model, coloring the second layer of the printed body slice physical model, and printing the second layer of the protection slice physical model).

The colours of the colour 3D physical model manufactured by the present disclosed example have better vivid and saturation because of using the colour print materials 40 having better color effect to print the body of the colour 3D physical model.

Figure 6:
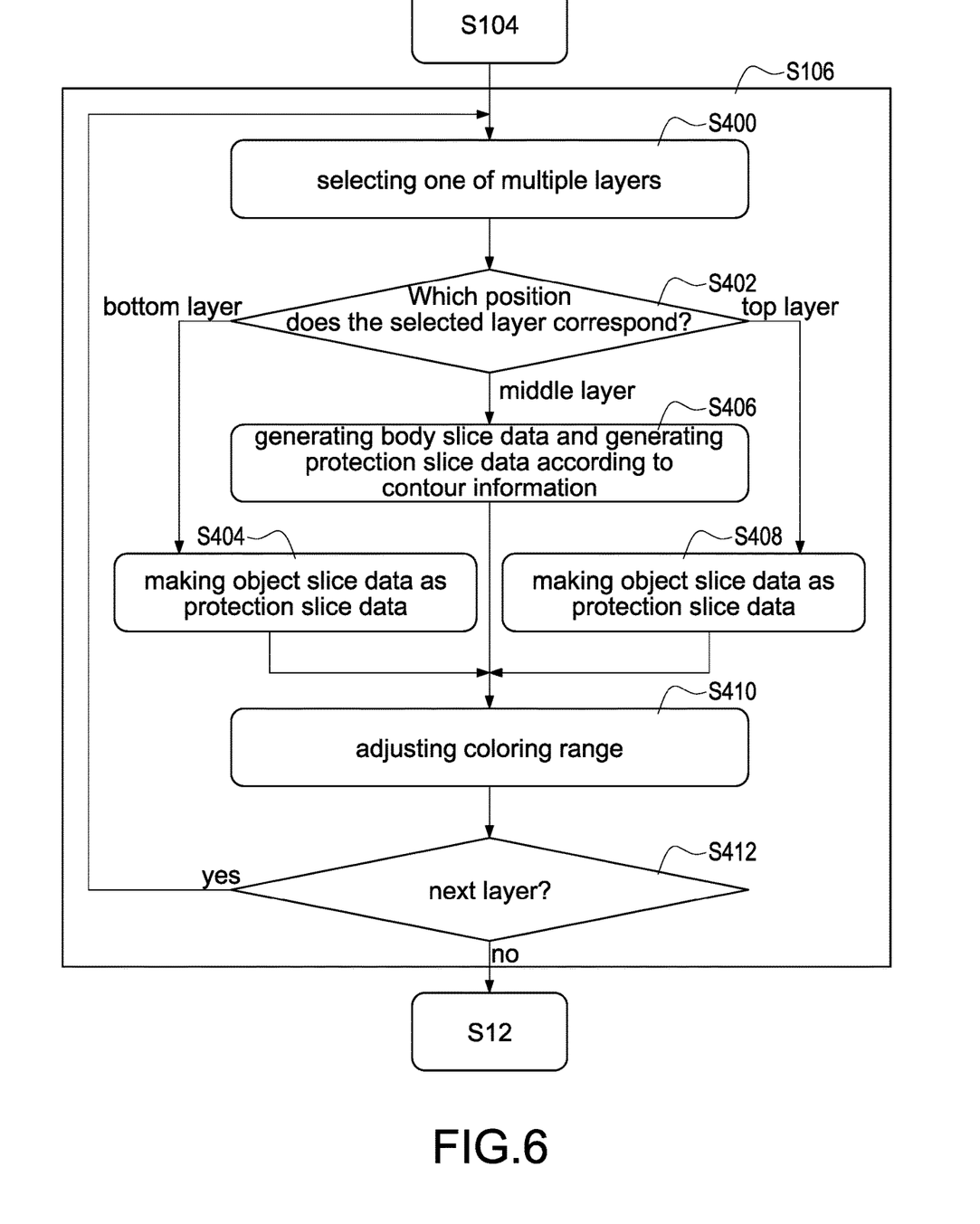
FIG. 6 is a partial flowchart of a slicing and printing method according to the fourth embodiment of the present disclosed example.

Please refer to FIG. 3 and FIG. 6 simultaneously, FIG. 6 is a partial flowchart of a slicing and printing method according to the fourth embodiment of the present disclosed example. The printing process of the printing and slicing method of this embodiment can configure the modeling range of each layer of the protection slice data and the body slice data according to the corresponding position of each layer of the slice data, and can configure the coloring range of each layer according to the corresponding position of each layer of the slice data. Compare to the slicing and printing method shown in FIG. 3, the step S106 of the slicing and printing method of this embodiment comprises following steps.

Step S400: the electronic device 2 selects one of the multiple layers of slice data in order, such as selecting the first layer of the object slice data and colour slice data.

Step S402: the electronic device 2 determines a corresponding position of the selected layer of the object slice data, the corresponding position is in the multiple layers of the object slice data.

If the electronic device 2 determines that the selected layer of the object slice data is a bottom layer (namely, the first layer), the electronic device 2 performs the step S404. If the electronic device 2 determines that the selected layer of the object slice data is a middle layer, the electronic device 2 performs the step S406. If the electronic device 2 determines that the selected layer of the object slice data is a top layer (namely, the last layer), the electronic device 2 performs the step S408.

Step S404: the electronic device 2 directly makes the bottom layer of the object slice data as the bottom layer of the protection slice data, and does not generate the same layer of the body slice data.

Thus, the bottom layer of the protection slice physical model can completely cover the bottom of the body region of the colour 3D physical model after print.

Step S406: the electronic device 2 generates the same layer of the body slice data according to the selected layer of the object slice data, and generates the same layer of the protection slice data according to a contour region of the selected layer of the object slice data. Thus, the protection slice physical model located in the middle layer can completely cover the side-wall of the colour 3D physical model after print.

Step S408: the electronic device 2 directly makes the top layer of the object slice data as the top layer of the protection slice data, and does not generate the same layer of the body slice data. Thus, after print, the top layer of the protection slice physical model can completely cover the top region of the body region of the colour 3D physical model.

Step S410: the electronic device 2 configures a coloring range of the selected layer of the colour slice data according to the corresponding position of the selected layer of the colour slice data, the corresponding position is in the multiple layers of the colour slice data.

One of the exemplary embodiments, the electronic device 2 configures the coloring range of the selected layer of the colour slice data according to a size of the next layer (namely, the second layer) of the body slice physical model (the size may be obtained via analyzing the next layer of the body slice data) if determining that the selected layer of the colour slice data is bottom layer. Furthermore, the configured coloring range of the selected layer of the colour slice data may be the same as the size of the next layer of the body slice physical model.

One of the exemplary embodiments, the electronic device 2 configures the coloring range of the selected layer of the colour slice data according to a size of the last layer (namely, the antepenultimate layer) of the body slice physical model (the size may be obtained via analyzing the last layer of the body slice data) if determining that the selected layer of the colour slice data is sub top layer (namely, the penultimate layer). Furthermore, the configured coloring range of the selected layer of the colour slice data may be the same as the size of the last layer of the body slice physical model.

One of the exemplary embodiments, the electronic device 2 configures the selected layer of the colour slice data as no coloring if the selected layer of the colour slice data is a top layer. More specifically, the top layer of the colour 3D physical model is protection slice physical model, and is not necessary to be colored.

One of the exemplary embodiments, the electronic device 2 configures the selected layer of the colour slice data as no coloring if the selected layer of the colour slice data is a sub top layer (the second layer). More specifically, because whole surface of the first layer of the colour 3D physical model are colored, it does not affect the visual experience significantly that the second layer is colored or not. Thus, this embodiment does not color the second layer for reducing the usage of the ink.

One of the exemplary embodiments, the electronic device 2 configures the coloring range of the same layer of the colour slice data to comprise a side-wall or an outside surface of the same layer of the body slice physical model if the selected layer of the colour slice data is a middle layer. Furthermore, the coloring nozzle 332 may move to the edge of the body slice physical model and jet out the ink to the side-wall of the body slice physical model for coloring during print.

Figure 7:
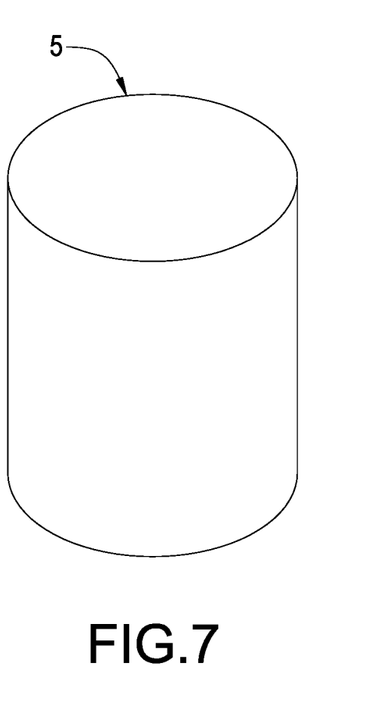
FIG. 7 is a schematic view of colour 3D object data according to the present disclosed example.
Figure 8:
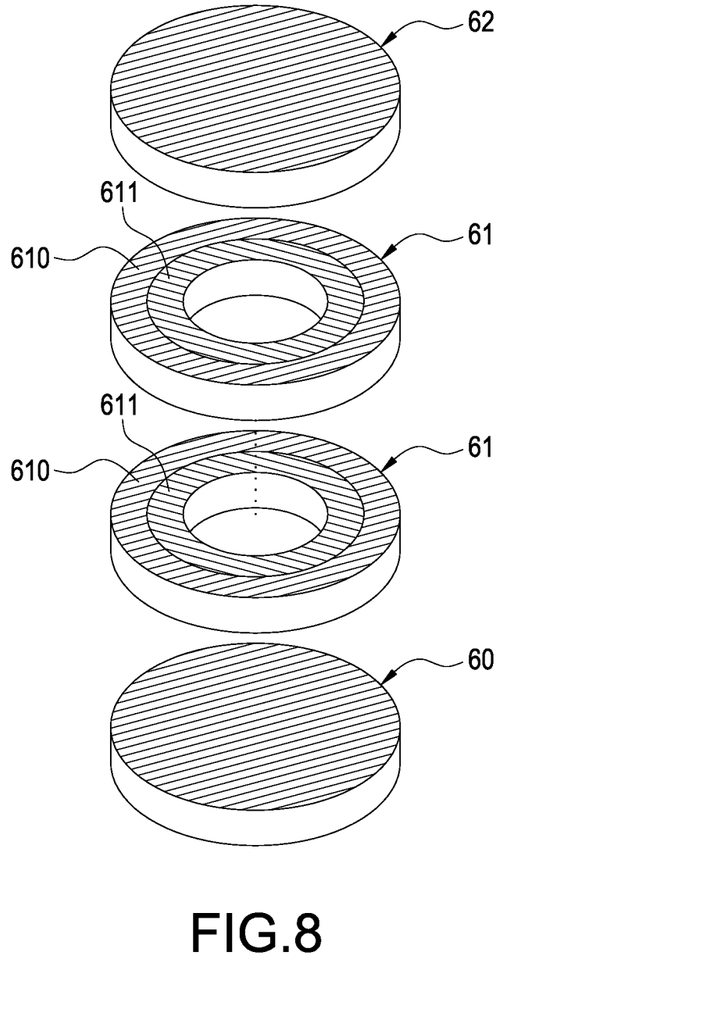
FIG. 8 is a schematic view of object slice data according to the present disclosed example.

Please refer to FIG. 7 and FIG. 8 simultaneously, FIG. 7 is a schematic view of colour 3D object data according to the present disclosed example, and FIG. 8 is a schematic view of object slice data according to the present disclosed example.

As shown in figures, the electronic device 2 may load the colour 3D object data corresponding to a colour 3D object 5, and execute the slicing process for dividing the colour 3D object 5 into multiple layers of slice object 60-62 (namely, generating multiple layers of slice object data). Moreover, each layer of the object slice data corresponding to the slice object 60, 62 and the contour region 610 of the slice object 61 is directly configured as the protection slice data, and the layer of the object slice data corresponding to a body region 611 of the slice object 61 is directly configured as the body slice data.

Figure 9:
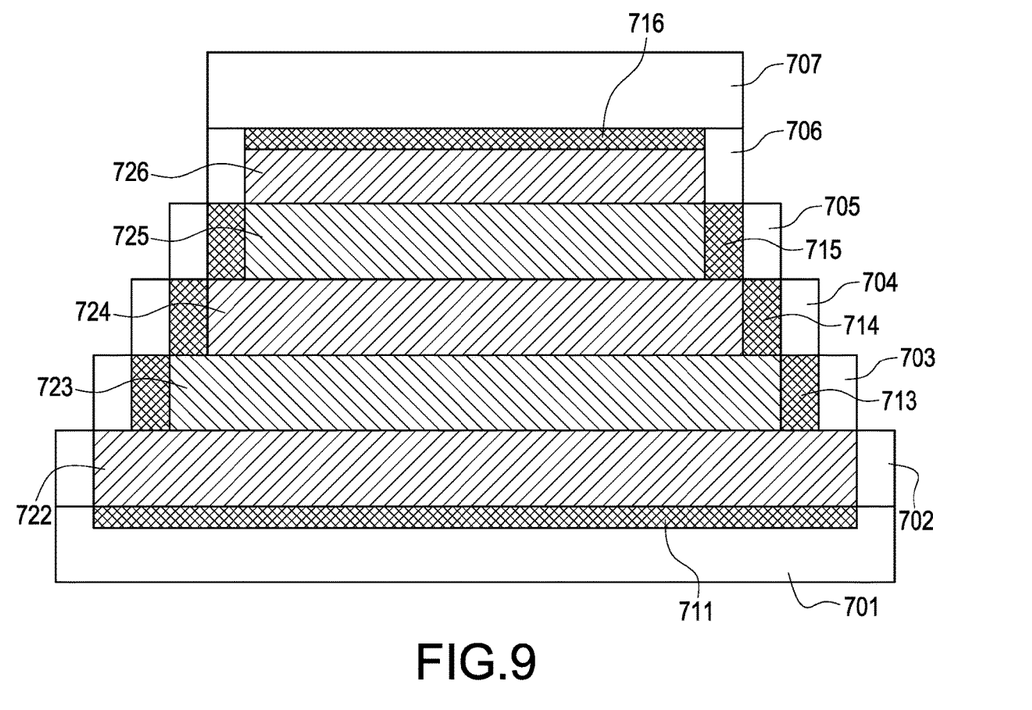
FIG. 9 is a schematic view of print according to one of embodiments of the present disclosed example.

Please refer to FIG. 9, which is a schematic view of print according to one of embodiments of the present disclosed example. FIG. 9 is used to explain how to print the colour 3D physical model with protective film in the present disclosed example.

As shown in figure, the colour 3D printer 3 first controls the modeling nozzle 330 to use the light-transmissive print materials 41 to print a layer of the light-transmissive protection slice physical model 701, and then controls the coloring nozzle 332 to jet a layer of colour coating 711 on whole upper surface of the protection slice physical model 701. Thus, the colour 3D printer 3 completes the print of the first layer of the slice physical model.

Then, the colour 3D printer 3 controls the modeling nozzle 330 to use the colour print materials 40 to print a layer of the colored body slice physical model 722 stacked on the protection slice physical model 701, and controls the modeling nozzle 330 to use the light-transmissive print materials 41 to print a layer of the protection slice physical model 702 on the contour of the body slice physical model 722. Thus, the colour 3D printer 3 completes the print of the second layer of the slice physical model.

Then, the colour 3D printer 3 controls the modeling nozzle 330 to use the colour print materials 40 to print a layer of the body slice physical model 723, controls the coloring nozzle 332 to jet a layer of colour coating 713 on the side-wall and the outer surface of the body slice physical model 723, and controls the modeling nozzle 330 to use the light-transmissive print materials 41 to print a layer of the protection slice physical model 703 on the contour of the body slice physical model 723. Thus, the colour 3D printer 3 completes the print of the third layer of the slice physical model. Then, the colour 3D printer 3 repeats above steps for printing the fourth layer of the protection slice physical model 704, body slice physical model 724 and colour coating 714, and printing the fifth layer of the protection slice physical model 705, body slice physical model 725 and colour coating 715.

Then, the colour 3D printer 3 controls the modeling nozzle 330 to use the colour print materials 40 to print a layer of the colored body slice physical model 726, controls the coloring nozzle 332 to jet a layer of colour coating 716 on whole upper surface of the body slice physical model 726, and controls the modeling nozzle 330 to use the light-transmissive print material 41 to print a layer of protection slice physical model 706 on a contour of the body slice physical model 726. Thus, the colour 3D printer 3 completes the print of the sixth layer of the slice physical model.

Finally, the colour 3D printer 3 controls the modeling nozzle 330 to use the light-transmissive print materials 41 to print a layer of the light-transmissive protection slice physical model 707 by stacking. Thus, the colour 3D printer 3 completes the print of all of the multiple layers of the slice physical models.

Figure 10:
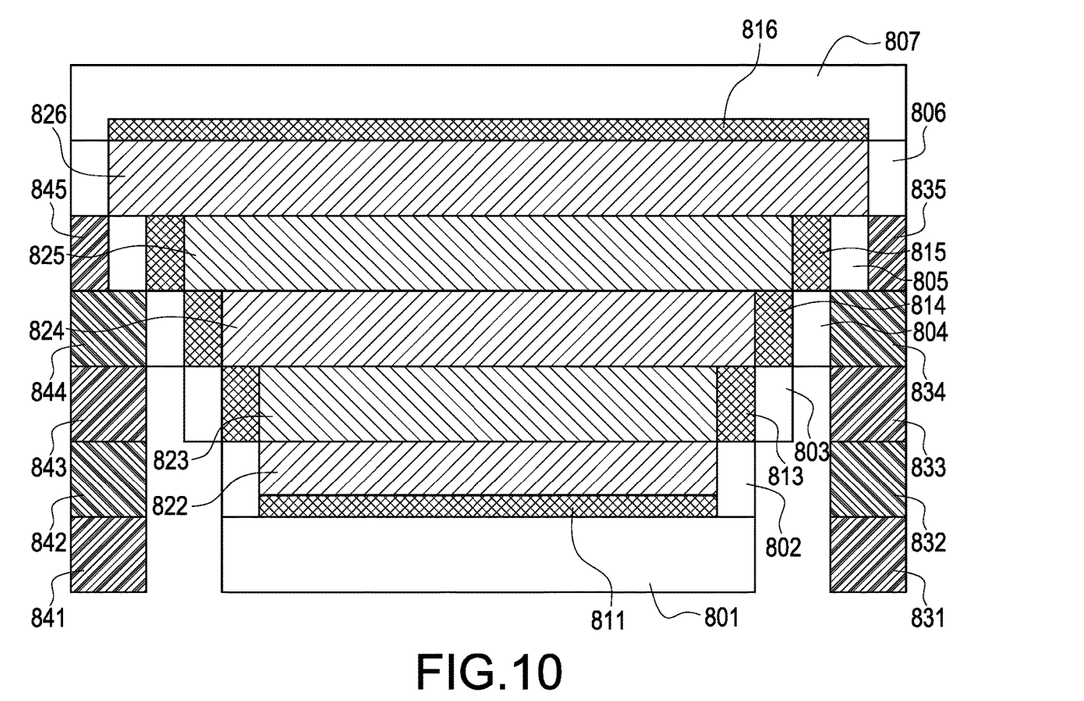
FIG. 10 is a schematic view of print according to another one of embodiments of the present disclosed example.

Please refer to FIG. 10, which is a schematic view of print according to another one of embodiments of the present disclosed example. FIG. 10 is used to explain how to print a colour 3D physical model with protective film and two support structure stacked by the multiple layers of support slice physical models 831-835 and the multiple layers of support slice physical models 841-845 respectively.

As shown in figure, the difference between this embodiment and the embodiment shown in FIG. 9 is that this embodiment prints the same layer of the support slice physical models 831-835 and the support slice physical models 841-845 simultaneously when printing each of the multiple layers of the protection slice physical models 801-807, the body slice physical models 822-826 and the colour coatings 811-816.

Because the heights of the support slice physical models 831-835 and the support slice physical models 841-845 are the same or similar as the heights of the protection slice physical models 801-807 and the body slice physical models 822-826 during print, the present disclosed example can effectively provide support force timely and prevent the colour 3D physical model from collapsing during print.

The above-mentioned are only preferred specific examples in the present disclosed example, and are not thence restrictive to the scope of claims of the present disclosed example. Therefore, those who apply equivalent changes incorporating contents from the present disclosed example are included in the scope of this application, as stated herein.

What is claimed is:

1. A slicing and printing method for colour 3D physical model with protective film, which is applied to a colour 3D printer comprising a modeling nozzle and a coloring nozzle, the slicing and printing method comprising following steps of:

a) executing a slicing process for generating multiple layers of object slice data according to geometric information of colour 3D object data;

b) in the slicing process, generating multiple layers of colour slice data according to colour information of the colour 3D object data, wherein each of the multiple layers of the colour slice data is a colour 2D image;

c) in the slicing process, generating multiple layers of body slice data according to the multiple layers of the object slice data, and generating multiple layers of protection slice data according to a plurality of contour information of the multiple layers of the object slice data, wherein each of the multiple layers of the body slice data and each of the multiple layers of the protection slice data correspond to each of multiple layers of print paths; and     d) controlling the modeling nozzle print to print multiple layers of body slice physical models layer by layer for manufacturing a body region of a colour 3D physical model according to the multiple layers of the body slice data, controlling the coloring nozzle to color the layer of the body slice physical model according to the same layer of the colour slice data if one of the multiple layers of the body slice physical models has been printed and is determined to be colored, and controlling the modeling nozzle print to print multiple layers of protection slice physical models by using light-transmissive print materials layer by layer for manufacturing a protective film region of the colour 3D physical model according to the multiple layers of the protection slice data, wherein each of the multiple layers of the protection slice physical models surrounds the same layer of the body slice physical model, wherein the modeling nozzle is controlled to print each of the multiple layers of the body slice physical models and each of the multiple layers of the projection slice physical models along each of the multiple layers of the print paths, and the coloring nozzle is controlled for coloring according to a colour distribution of the same layer of the colour 2D image.

2. The slicing and printing method for colour 3D physical model with protective film according to claim 1, wherein the colour 3D printer is a Fused Deposition Molding 3D printer, the light-transmissive print materials is thermoplastic materials, the step d) is configured to control the modeling nozzle to heat the light-transmissive print materials for making the light-transmissive print materials molten, and print the multiple layers of the body slice physical models and the multiple layers of the protection slice physical models layer by layer by using the molten light-transmissive print materials.

3. The slicing and printing method for colour 3D physical model with protective film according to claim 1, wherein the colour 3D printer is a Fused Deposition Molding 3D printer, the step d) is configured to control the modeling nozzle to heat colour print materials for making the colour print materials molten, print the multiple layers of the body slice physical models layer by layer by using the molten colour print materials, heat the light-transmissive print materials for making the light-transmissive print materials molten, and print the multiple layers of the protection slice physical models layer by layer by using the molten light-transmissive print materials.

4. The slicing and printing method for colour 3D physical model with protective film according to claim 3, wherein the colour 3D printer comprises a material-switching device used to switch between the light-transmissive print materials and the colour print materials for provision, the step d) comprises following steps of:
   d1) controlling the material-switching device to switch to provide the colour print materials and execute an operation of clearing residual materials for consuming the residual light-transmissive print materials;
   d2) controlling the modeling nozzle to print one of the multiple layers of the body slice physical models by using the colour print materials;
   d3) controlling the coloring nozzle to color the layer of the printed body slice physical model;
   d4) controlling the material-switching device to switch to provide the light-transmissive print materials and execute the operation of clearing residual materials for consuming the residual colour print materials;
   d5) controlling the modeling nozzle to use the light-transmissive print materials to print the layer of the protection slice physical model around the same layer of body slice physical model; and
   d6) performing the step d1) to the step d5) repeatedly until the colour 3D physical model has been printed.

5. The slicing and printing method for colour 3D physical model with protective film according to claim 1, wherein the step a) comprises following steps of:
   a1) executing a hollowing process to the colour 3D object data corresponding to a colour 3D object for making the processed colour 3D object data correspond to the hollow colour 3D object;
   a2) generating the multiple layers of object slice data according to geometric information of the processed colour 3D object data and a default thickness value, wherein each of the multiple layers of the object slice data comprises a layer number respectively;
   a3) executing a support-adding process for generating multiple layers of support slice data corresponding to a support object, wherein each of the multiple layers of the support object data comprises a layer number respectively; and
   a4) executing a base-adding process according to the colour 3D object data for generating multiple layers of base slice data corresponding to a base object, wherein each of the multiple layers of the base object data comprises a layer number respectively.

6. The slicing and printing method for colour 3D physical model with protective film according to claim 5, wherein the colour 3D printer further comprises a print platform, the slicing and printing method for colour 3D physical model with protective film further comprises following steps of:
   e1) before the step d), controlling the modeling nozzle to print the multiple layers of the base slice physical models on the print platform by using the light-transmissive print materials layer by layer according to the multiple layers of the base slice data; and
   e2) controlling the modeling nozzle to use the light-transmissive print materials to print the multiple layers of the support slice physical models layer by layer according to the multiple layers of the support slice data during printing the multiple layers of the protection slice physical models and the multiple layers of body slice physical models;
   wherein the step d) is configured to print the multiple layers of the protection slice physical models and the multiple layers of the body slice physical models on the multiple layers of the base slice physical models.

7. The slicing and printing method for colour 3D physical model with protective film according to claim 1, wherein the step c) comprises following steps of:
   c11) generating the multiple layers of the protection slice data according to the plurality of the contour information of the multiple layers of the object slice data; and
   c12) executing a shrinkage process to the multiple layers of the protection slice data for generating the multiple layers of the body slice data.

8. The slicing and printing method for colour 3D physical model with protective film according to claim 1, wherein the step c) comprises following steps of:
   c21) generating a copy of the multiple layers of the object slice data, and making the copy as the multiple layers of the body slice data; and
   c22) executing an outspreading process to the multiple layers of the object slice data, and generating the multiple layers of the protection slice data according to the plurality of the contour information of the multiple layers of the processed object slice data.

9. The slicing and printing method for colour 3D physical model with protective film according to claim 1, wherein the step c) comprises following steps of:
   c31) making the same layer of the object slice data as the same layer of the protection slice data if anyone of the multiple layers of the object slice data is a bottom layer or a top layer; and
   c32) generating the same layer of the body slice data according to the same layer of the object slice data, and generating the same layer of the protection slice data according to the contour information of the layer of the object slice data if anyone of the multiple layers of the object slice data is a middle layer.

10. The slicing and printing method for colour 3D physical model with protective film according to claim 1, wherein the step b) comprises following steps of:
    b1) configuring a coloring range of the same layer of the colour slice data according to a size of the next layer of the body slice physical model if anyone of the multiple layers of the colour slice data is a bottom layer;

b2) configuring the coloring range of the same layer of the colour slice data according to a size of the last layer of the body slice physical model if anyone of the multiple layers of the colour slice data is a sub top layer; and b3) configuring the same layer of the colour slice data as no coloring if anyone of the multiple layers of the colour slice data is a top layer.

11. The slicing and printing method for colour 3D physical model with protective film according to claim 10, wherein the step b) comprises following steps of:

b4) configuring the same layer of the colour slice data as no coloring if anyone of the multiple layers of the colour slice data is a sub bottom layer; and b5) configuring the coloring range of the same layer of the colour slice data to comprise a side-wall or an outside surface of the same layer of the body slice physical model if anyone of the multiple layers of the colour slice data is a middle layer.

* * * * *